United States Patent [19]
Holtz et al.

[11] Patent Number: 5,158,933
[45] Date of Patent: Oct. 27, 1992

[54] PHASE SEPARATED COMPOSITE MATERIALS

[76] Inventors: Ronald L. Holtz, 15 W. Glebe Rd., #B21, Alexandria, Va. 22305; Gan-Moog Chow, 105 Westway Rd. Apt. #T-3, Greenbelt, Md. 20770; Alan S. Edelstein, 8002 Lynnfield Dr., Alexandria, Va. 22306

[21] Appl. No.: 613,003

[22] Filed: Nov. 15, 1990

[51] Int. Cl.$^5$ .................. H01B 12/02; H01L 27/00; C23C 14/34; B22F 7/04
[52] U.S. Cl. .................................... 305/1; 505/731; 505/816; 204/192.15; 204/192.24; 428/548; 428/551; 428/553; 428/558; 428/559; 428/554
[58] Field of Search ............... 428/546, 548, 551, 553, 428/554, 558, 559; 204/192.24, 192.1, 192.15; 505/1, 731, 816

[56] References Cited

U.S. PATENT DOCUMENTS

| | | | |
|---|---|---|---|
| 3,655,544 | 4/1972 | Rairden, III | 204/192 |
| 4,349,425 | 9/1982 | Miyake et al. | 204/192 P |
| 4,484,995 | 11/1984 | Pirich et al. | 204/192 M |
| 4,496,450 | 1/1986 | Hitotsuyanagi et al. | 204/192 M |

OTHER PUBLICATIONS

Holtz, et al., Enhanced magnetic anisotropy at the percolation threshold of Fe-SiO$_2$ composite thin films, Dec. 19, 1989, pp. 943-945.

Chow, et al., Alternative approach to nanocomposite syntheis by sputtering, *Appl. Phys. Lett.*, vol. 56, No. 19 Feb. 27, 1990, pp. 1953-1955.

Granqvist et al., "Ultrafine Metal Particles", *J. Appl. Phys.*, vol. 47, No. 5 pp. 2200-2219 (1976).

*Primary Examiner*—Brooks H. Hunt
*Assistant Examiner*—Daniel J. Jenkins

[57] ABSTRACT

A method of forming a phase-separated composite material which utilizes sputtering in a thermal gradient at relatively high sputtering pressures generally above about 0.1 Torr sufficient to produce nanoscale particles which are embedded in a continuous phase matrix produced by normal sputtering. This method avoids the alloying and/or compound formation which prevents preparation of phase-separated composites by conventional co-sputtering, and the invention thus enables particulate composites to be formed from entirely new classes of materials. Microhardness testing shows that the phase-separated composites produced by the present invention have an increased hardness compared to the pure matrix material.

38 Claims, 1 Drawing Sheet

PHASE SEPARATED COMPOSITE MATERIALS

BACKGROUND OF THE INVENTION

Sputtering is a process based on the disintegration of a cathode material in a vacuum when bombarded by positive ions. Atoms of the cathode material or target are ejected in various directions, and ultimately alight upon and cling firmly to adjacent surfaces, forming a sputtered film. Sputtering is a standard method for producing thin films. This phenomenon can be utilized to form very fine-grained metal coatings on substrates exposed to sputtering. Glass plates may thus be silvered, or suspension fibers of spun quartz rendered conductive for use in electrometers, etc. In addition to metal films, sputtering can be used to deposit films of a broad range of insulators and semiconductors on various substrates. Films composed of more than one material can be obtained by using cathodes or targets made of those materials. Normal sputtering operations for film deposition employ sputtering gas pressures of 0.01 Torr or less.

Various sputtering related techniques are known for producing composite materials. Rairden, U.S. Pat. No. 3,655,544 discloses a sputtering method, performed at a constant pressure within the range of 1.0 to 200 milliTorr, for producing a resistor film, consisting essentially of tungsten, molybdenum and their respective nitrides, on an alumina substrate, wherein electrical contact can then be made to the resistor film by depositing aluminum on the film by vacuum evaporation at pressures less than $5 \times 10^{-5}$ Torr. Miyake et al., U.S. Pat. No. 4,349,425 discloses a sputtering method, performed at a constant pressure within the range of $10^{-3}$ to $10^{-1}$ Torr, which utilizes a mixture of inert gas and oxygen gas for oxidizing sputtered metal atoms to form a film of the oxides of cadmium and tin. Pirich et al., U.S. Pat. No. 4,484,995 discloses a sputtering method, performed at a constant pressure within the range of 10 to 200 milliTorr, for producing a coating of a ferromagnetic alloy of a rare earth-transition element mixture on an aluminum substrate at substrate temperatures as low as 25° C. Hitosuyanagi et al., U.S. Pat. No. 4,496,450 discloses a process, performed at a constant pressure within the range of $5 \times 10^{-3}$ to 1 Torr, for producing a multi-component thin film which includes joint use of a sputtering method and a plasma chemical vapor deposition (CVD) method which produces an amorphous silicon material having a sputtered aluminum dopant. None of the aforementioned processes will produce a phase separated composite comprising a continuous phase matrix of a first element having discrete nanoscale particles of a second element dispersed therein.

Phase-separated materials have been used in electronic, magnetic, and glass-ceramic applications. It is possible to deposit certain limited classes of phase-separated composite thin films by ordinary thin film deposition techniques, but only if the two components are immiscible and do not form stable compounds. For example, composites of iron particles in a matrix of amorphous silica can be produced by cosputtering iron and silica [See Holtz et al., "Enhanced Magnetic Anisotropy at the Percolation Threshold of Fe-SiO$_2$ Composite Thin Films", *Appl. Phys. Lett.*, Vol 56, No. 10, pp. 943–5 (1990)]. The possible applications of phase-separated materials are limited, however, by the fact that immiscible materials must be used in order to avoid the formation of alloys, and materials which do not react with each other must be used, in order to avoid the formation of new chemical compounds. This greatly restricts the choice of materials which can be used.

SUMMARY OF THE INVENTION

It is an object of the present invention to provide a composite material in which a continuous phase matrix of one element has discrete nanoscale particles of a second element dispersed therein.

Another object of the invention is to provide a method of producing a composite material in which alloying and/or chemical reaction between the elements of the composite are avoided even when normally miscible or mutually reactive elements are used.

Yet another object of the present invention is to provide a method of producing a sputtered composite material which enables the relative proportions of the elements which make up the composite to be conveniently regulated.

It is also an object of the present invention to provide a method for producing a composite material comprising a continuous phase matrix of one element having discrete nanoscale particles of a second element dispersed therein, in which the sizes of the dispersed particles can be conveniently regulated.

These and other objects are achieved by providing a method of producing a composite material comprising the steps of a) sputtering a continuous phase layer of a first element from a first sputtering target onto a substrate at a first sputtering pressure which is sufficiently low that a continuous phase layer is deposited; b) maintaining a thermal gradient between the substrate and a second sputtering target composed of a second element whereby the substrate is a lower temperature than the second sputtering target, and sputtering a layer of discrete particles of the second element having a particle size in the range from about 1 to about 50 nm from the second sputtering target onto the previously deposited sputtered layer of the first element on the substrate at a second sputtering pressure higher than said first sputtering pressure, said second sputtering pressure being sufficiently high that a layer of discrete particles is deposited; and c) sputtering a further continuous phase layer of the first element over the layer of discrete particles at a third sputtering pressure lower than said second sputtering pressure, said third sputtering pressure being sufficiently low that a continuous phase layer is deposited.

The objects of the invention are also achieved by providing a composite material comprising a) a sputtered continuous phase initial layer of a first element; b) a layer of sputtered discrete particles of a second element having a particle size in the range from about 1 to about 50 nm deposited on the initial layer; and c) a sputtered continuous phase overlayer of the first element deposited over the layer of discrete particles.

In accordance with a preferred aspect of the invention, a plurality of alternating layers of discrete particles of the second element and continuous phase overlayers of the first element are alternately applied to the substrate to build up a composite of desired thickness.

The present invention relates to a new synthesis technique based on modulating the sputtering pressure between high and low pressure ranges to alternately deposit thin films and fine powder layers in order to form a multi-layered composite of small particles of one metal embedded within a matrix of another metal. It has been found that very fine powder may be produced operating at higher than normal sputtering pressures, for example at 0.1 to 1 Torr or more, and including a cold surface within the sputtering chamber in order to create convective currents within the sputtering gas. Sputtering at higher pressure in a thermal gradient results in particles being formed in the vapor phase which then are deposited as discrete particles on the substrate. Although the formation of nanoscale particles in a vapor has been known for some time [See Granqvist et al., *J. Appl. Phys.*, Vol. 47, p. 2200 (1976)], the use of this phenomenon to incorporate discrete particles in a sputtered composite material is totally new.

The invention will be described hereinafter with reference to composite materials formed of discrete crystalline particles of molybdenum dispersed in a crystalline aluminum matrix. Aluminum and molybdenum are normally miscible with each other and mix to form amorphous alloys when co-sputtered simultaneously. Aluminum and molybdenum also tend to react in the vapor phase to form stable compounds such as $Al_3Mo$ and $AlMo_3$. The production of a composite in which these elements form separate phases is a unique result which demonstrates the distinctness of the present invention. The invention is not, however, restricted to the elements aluminum and molybdenum, but can, in principle, be used to form composites of any material which can be sputtered. Thus, particles of all phases can be formed in any matrix, and the invention provides greatly increased flexibility in the choice of materials for producing composites for various electronic, magnetic and glass-ceramic applications, including such possible new applications as high-temperature coatings and nanoscale dispersion-strengthened coatings.

In accordance with the invention, a thermal gradient is established between the sputtering target from whence the sputtered atoms originate and the substrate on which the atoms deposit. This thermal gradient between the hot source and the cold substrate provides a convective circulation to transport the sputtered particles to the substrate. Such a thermal gradient has been found to significantly enhance the deposition rate of the nanoscale particles. The deposition rate increases because both the collision frequency and the sticking coefficient of the particles with the substrate increase.

BRIEF DESCRIPTION OF THE DRAWINGS

The invention will be described in further detail with reference to the accompanying drawings in which.

DETAILED DESCRIPTION OF PREFERRED EMBODIMENTS

Figure 1:
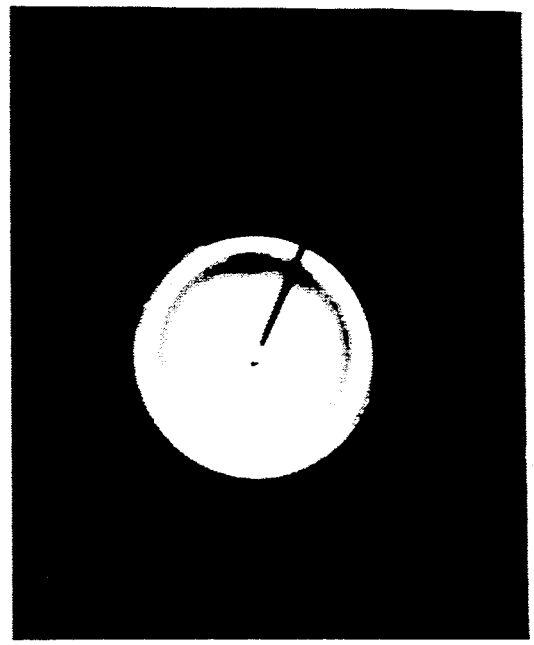
FIG. 1 is a transmission electron microscopy diffraction pattern of a nanocomposite film comprising an aluminum matrix and a dispersed molybdenum particle phase produced according to the present invention.

The present invention is based on the concept of modulating the sputtering pressure between high and low pressure ranges to alternately deposit a fine powder of one element and a thin film of another element in order to form a multilayered composite of small particles of the first element dispersed within a continuous matrix of the other element. Since according to the present invention, the powder and film components of the composite are deposited independently of each other, it is possible to form composites from any combination of sputterable materials.

The continuous film component can be any material which can be sputtered. Examples of possible materials for the continuous phase layer include aluminum, silicon, titanium, vanadium, chromium, manganese, iron, cobalt, copper, germanium, yttrium, niobium, molybdenum, barium, lanthanum-strontium-copper and yttrium-barium-copper high temperature superconductors, variousiron-nickel "permalloy"-type alloys, neodymium-iron-boron permanent magnet material, molybdenum-silicon compounds, silicon dioxide, aluminum oxide, aluminum nitride, iron oxide, iron nitride, and boron nitride. Numerous other materials may also be used.

The nanoscale particle or powder layer produced by sputtering at high pressures can also be formed of any material which can be sputter deposited. Good results are obtained with metals; for example fine powders have been produced with molybdenum, iron, copper and cobalt. Nanoscale particle layers can also be obtained from semiconductors or from materials such as silicon dioxide (amorphous silica).

Nanoscale phase-separated materials are usually fabricated by co-sputtering at a pressure of approximately $10^{-3}$ Torr. At such pressures, the mean free path is approximately $5 \times 10^{-2}$ meters. Hence, sputtered species arrive at the substrate without suffering many collisions, and the sputtered material forms directly as a film on the substrate.

At a higher pressure of about 0.1 Torr, the mean free path for the sputtered species is only approximately $5 \times 10^{-4}$ meters, and the collision frequency in the gas phase is significantly higher. Nucleation and growth of the sputtered species to form particles therefore can occur in the vapor phase before the ejected atoms from the target arrive at the substrate surface on which they deposit. Thus, the sputtered material deposits on the substrate as discrete particles, rather than as a continuous film.

In general the process of the invention involves establishing a thermal gradient between two sputtering sources and a substrate on which a sputtered composite is to be deposited. Then an initial matrix layer of one element is deposited on the substrate under normal sputtering conditions. Subsequently, the inert gas sputtering pressure in the sputtering chamber is increased 100-fold or more, and a layer of nanoscale particles of the second element is deposited on the initial layer by high pressure sputtering. The sputtering pressure is subsequently reduced to its initial value, and a covering layer of matrix material is then deposited to embed the discrete particles. This sequential deposition process is continued until a composite coating is obtained having the desired thickness.

The formation of a composite consisting of discrete nanoscale particles of crystalline molybdenum dispersed in a continuous matrix of aluminum is highly significant because prior to the present invention, no other way was known of making such a composite.

A composite material of any desired thickness may be built up by alternately repeating the discrete particulate phase and continuous matrix phase deposition steps until the desired thickness is obtained. For example, individual sublayers each having a thickness of about 25 nm can be repeatedly applied to a substrate to produce a composite film having a total thickness in the range from about 100 nm to about 500 nm. The sequential deposition process can be repeated indefinitely so that composite films several thousand nm thick can be obtained.

Any suitable cooling means may be used to establish the desired temperature gradient. Good results have been obtained by cooling the substrate on which the sputtered atoms deposit with liquid nitrogen in order to establish a maximum temperature gradient. The size of the sputtered particles varies depending upon the temperature gradient which affects the circulation velocity, on the sputtering rate which is a function of the sputtering power (sputtering voltage times sputtering current), and on the sputtering pressure. By appropriate adjustment of these parameters, especially the sputtering pressure, it is possible to control the particle size of the discrete particles which are deposited. Without being bound to any particular theory, it is believed that these parameters affect the particle size by varying the residence time of the coalescing particles in the vapor phase before the particles deposit on the substrate. Since the particles are believed to grow by diffusion, the residence time of the coalescing particles in the vapor phase is crucial.

For depositing pure materials, an inert gas atmosphere is preferably maintained in the sputtering chamber. Suitable gases include, for example, argon, neon, krypton and xenon. Argon is generally preferred because of its ready availability in high purity. Excellent results have been obtained in accordance with the invention using an argon gas sputtering atmosphere.

Certain kinds of compounds can be deposited by reactive sputtering in which a reactive or non-inert gas is introduced into the sputtering environment. Typically the non-inert gas is present as a minor component in an atmosphere composed predominantly of an inert gas such a argon. Oxides or nitrides can be produced by adding oxygen or nitrogen, respectively. For example, adding some oxygen while sputtering iron produces iron oxide. It is preferred to produce oxide and/or nitride compounds by reactive sputtering techniques rather than by sputtering solid oxide or nitride compound sources. Reactive sputtering may be used for producing continuous film layers and/or nanoscale particle layers. For example, particles of iron oxide produced by reactive sputtering of iron in an oxygen-argon mixture at suitably high pressure are of interest for magnetic recording media. A powder containing a mixture of cobalt and cobalt oxide has been produced by sputtering cobalt in an atmosphere that contained some residual air and water vapor. Electron microscope examination of the resulting powder suggested that the oxide formed as a coating on the surface of particles with a cobalt core.

The sputtering pressure at which a continuous phase film is deposited may vary depending on the parameters of the specific sputtering system used. Without being bound to any theory, it is believed that the mean free path of the sputtered atoms must be larger than the distance from the sputter source to the substrate for film formation to occur. In general, the mean free path decreases as the sputtering pressure increases. This means that if the sputtering target is closer to the substrate on which the sputtered atoms are to be deposited, continuous films may be formed at higher sputtering pressures. Depending on the sputtering apparatus, continuous films can be produced at pressures up to about 0.1 Torr. For a triode-magnetron sputtering system of the type use by the present inventors, the continuous matrix phase generally will be deposited at a sputtering pressure of less than about 0.05 Torr, preferably less than about 0.02 Torr, particularly preferably up to about 0.01 Torr. It is especially preferred to operate at a sputtering pressure in the range from about 0.001 to about 0.005 Torr, most especially from about 0.002 to about 0.003 Torr. It is considered within the skill of the art to select appropriate sputtering pressures for other types of sputtering systems based on the foregoing principles.

Similarly, the sputtering pressure at which layers of discrete particles are formed also may vary depending on the parameters of the sputtering system. Again without being bound to a particular theory, it is believed that the mean free path of the sputtered atoms must be significantly shorter than the distance from the sputtering source to the substrate for particle or powder formation to occur. In general, the closer the sputtering source is to the substrate, the higher the sputtering pressure must be to obtain a particle layer. Normally, the sputtering pressure should be at least 0.1 Torr to produce a powder or particle layer. For a triode-magnetron sputtering system of the type used by the present inventors, the higher pressure sputtering of a layer of discrete particles of said second element is preferably carried out at a sputtering pressure in the range from about 0.1 to about 10 Torr. Desirably, pressures in the range from about 0.15 to about 1 Torr are used. It is preferred to deposit the layer of particles at a sputtering pressure in the range from about 0.2 to about 0.7 Torr, especially from about 0.3 to about 0.6 Torr. It is considered within the skill of the art to select appropriate sputtering pressures for producing particle layers with other types of sputtering systems based on the foregoing principles.

The sputtering pressure during sputtering of the layer of discrete particles desirably is from about 10 to about 1000 times the sputtering pressure during sputtering of the continuous layers, and advantageously is at least about 100 times the continuous layer sputtering pressure.

The substrate on which the composite material is to be formed may be disposed various distances from the sputtering targets. Distances in the range from about 2 to about 20 centimeters are suitable. Preferably the substrate will be spaced a distance in the range from about 5 to about 12 centimeters from the second sputtering target during sputtering of the layer of discrete particles. It is particularly preferred that the substrate be disposed from about 7 to about 10 centimeters from the second sputtering target during sputtering of the discrete particle layer.

The size of the particles in the layer of discrete particles can be varied by adjusting the sputtering pressure, and also to some extent by adjusting the sputtering power. The particle sizes of the discrete particles generally will fall in the range from about 1 to about 50 nm. For molybdenum, typical particle sizes range from about 2 to about 20 nm. Very advantageous composite materials have been produced wherein the particle layers contain discrete molybdenum particles having a size in the range from about 3 to about 12 nm. Particle sizes for copper or cobalt tend to run a little larger for the same processing conditions.

The method of the invention makes it possible to produce a phase-separated composite material in which each of the phases is crystalline. This is confirmed by transmission electron spectra of the composite material which show only interplanar spacings corresponding to superimposed individual spectra of the first and second elements. Such spectral data clearly indicates that neither chemical reaction, nor alloying is occurring in the formation of the sputter material.

As noted above, the sputtering pressure during sputtering of the layer of discrete particles is significantly higher than the sputtering pressure which prevails during sputtering of the continuous phase layer. Preferably the sputtering pressure during sputtering of the particle layer is at least 10 times the pressure during the sputtering of the continuous phase layers, and it is particularly preferred that the sputtering pressure during sputtering of the discrete particle layer be at least 100 times the continuous phase layer sputtering pressure. If desired, the sputtering pressure can be adjusted during sputtering of the layer of discrete particles in order to regulate the size of the deposited particles.

The sputtering power may vary of a wide range depending upon the identity of the elements being sputtered and the desired sputtering rate. For continuous phase layers, it is considered within the skill of the art to select an appropriate sputtering power. Suitable continuous aluminum layers can be sputtered from a 5.7 cm diameter sputtering target at a sputtering power in the range from about 20 watts to about 2,000 watts (approximately 2.5 to 250 watts/cm$^2$). Excellent results have been obtained in sputtering continuous phase aluminum layers from a 5.7 cm diameter aluminum sputtering target at a sputtering power of about 400 watts (approximately 50 watts/cm$^2$).

The applied sputtering power during sputtering of the layer of discrete particles may be somewhat less than the sputtering power used to deposit the continuous phase layer. This facilitates more precise control of the particle deposition. Layers of discrete molybdenum particles can suitably be sputtered from a 5.7 cm diameter sputtering target at a sputtering power in the range from about 50 watts to about 200 watts (6.25 watts/cm$^2$ to 25 watts/cm$^2$). Very satisfactory results have been obtained at a sputtering power of about 150 watts (approximately 18.5 watts/cm$^2$). The sputtering power may be controlled or adjusted during sputtering of the layer of discrete particles in order to regulate the volume percent of the second element in the composite material.

The volume fraction of particles of the second element in the composite may be reduced to very low values approaching zero by reducing the deposition time and sputtering power of the particle phase material and increasing the deposition time and sputtering power for the continuous phase layers. In practice the volume-percent of the particle phase material in the composite may range from about 0.1 vol.-% to about 63 vol.-%. Particle phase volume fractions of 50 vol.-% can be routinely achieved. Composites of a continuous aluminum matrix containing molybdenum particle phase volume fractions ranging from about 5 vol.-% to about 20 vol.-% have been produced with good properties.

Similarly, the temperature difference of the thermal gradient between the sputtering targets and the deposition substrate can be regulated during sputtering of the layer of discrete particles in order to regulate the velocity at which particles migrate from the sputtering target to the substrate.

Further details of the invention will be apparent from a consideration of the following non-limiting examples of composite materials formed of aluminum and molybdenum. These elements are normally miscible with each other and tend to form alloys when co-sputtered. Consequently, they provide an excellent illustration of the capability of the invention to form composite materials containing discrete phases of normally miscible elements. The invention is not limited to these elements, however, but instead is considered applicable to any materials, miscible or immiscible, which can be deposited on a substrate by sputtering.

EXAMPLE 1

A quartz substrate was mounted on a liquid-nitrogen-cooled substrate table in a sputtering apparatus. The table was spaced a distance of about 7 centimeters from individual sputtering targets of aluminum and molybdenum. An argon gas pressure of $2 \times 10^{-3}$ Torr was maintained within the sputtering chamber, and a continuous phase aluminum matrix layer was sputtered onto the substrate at a rate of approximately 50 nm per minute using a 2.25 inch L. M. Simard triode-magnetron source at a power of 400 watts.

The argon pressure within the sputtering chamber was increased to 0.2 Torr, and molybdenum was sputtered onto the previously deposited aluminum matrix using a separate 2.25 inch L. M. Simard triode-magnetron source at a power of 150 watts (voltage=300 V; current=0.5 amps). Discrete particles of molybdenum having a substantially uniform particle size of about 12 nm were deposited on the aluminum layer.

The argon pressure within the sputtering chamber was again reduced to approximately 0.002 Torr, and an aluminum overlayer was sputtered over the layer of molybdenum particles. Alternating depositions of aluminum and molybdenum were continued until a composite film was obtained having a thickness of approximately 0.5 $\mu$m (500 nm). The resulting composite material contained approximately 20 volume percent molybdenum in the form of discrete nanoscale particles embedded within an aluminum matrix.

The resulting composite film was investigated by x-ray diffraction, transmission electron diffraction, x-ray fluorescence spectroscopy, energy dispersive x-ray spectroscopy and microhardness testing. Single cycles of aluminum/molybdenum/aluminum were deposited on carbon-coated transmission electron microscopy grids for transmission electron microscopy examination.

Both the x-ray diffraction and transmission election diffraction spectra of the composite films showed only interplanar spacings corresponding to aluminum and molybdenum. This indicates that the aluminum and molybdenum are present in discrete phases, instead of intermixing to form an alloy or reacting to form a compound.

EXAMPLE 2

The procedure of Example 1 was repeated except that the argon pressure during molybdenum sputtering was 0.4 Torr. Layers of molybdenum particles having a substantially uniform particle size of about 7 nm were obtained.

EXAMPLE 3

The procedure of Example 1 was again repeated, except that the argon pressure during molybdenum sputtering was approximately 0.6 Torr. Layers of molybdenum particles having a substantially uniform particle size of about 3 nm were obtained.

EXAMPLE 4

The procedure of Example 1 was repeated except that the sputtering power during molybdenum sputtering was reduced to 50 watts (voltage=100 V; current=0.5 amp). The resulting composite contained approximately 5 volume percent molybdenum in the form of discrete particles embedded within an aluminum matrix.

EXAMPLE 5

The procedure of Example 1 was repeated except that the argon pressure during sputtering of the molybdenum particle layer was 0.6 Torr. The resulting particles had a substantially uniform particle size of about 3 nm. Some particle agglomeration was observed.

EXAMPLE 6

The procedure of Example 1 was followed except that the sputtering pressure was 0.15 Torr. The resulting layer of discrete crystals contained a bimodal distribution of two sizes of well-faceted nanocrystals having particle sizes of 20 nm and 5 nm, respectively.

STRENGTH TEST

Microindentation measurements were performed on pure aluminum films and on nanocomposite films having the same nominal thickness produced according to the present invention. The measurements were made using an Anton Paar MHT-4 microhardness tester with a 0.3 gram load and a 15 second hold time. The aluminum film was found to have a hardness of 103 kg/mm$^2$, and the hardness of the nanoscale particle composites according to the invention was about 2 to 4 times larger, depending on the particle size and the volume fraction of molybdenum. The enhanced microhardness of the composite materials according to the invention is believed to result from strengthening of the aluminum matrix by the molybdenum particles.

COMPARATIVE EXAMPLE 1

Aluminum and molybdenum were co-sputtered onto a quartz substrate at room temperature and a sputtering pressure of 0.003 Torr. The result was an amorphous alloy film of aluminum and molybdenum.

COMPARATIVE EXAMPLE 2

The procedure of Comparative Example 1 was repeated except the substrate was cooled with liquid-nitrogen. An amorphous alloy film of aluminum and molybdenum was again obtained.

The examples demonstrate the phenomenon that for sputtering pressures in the range of 0.1 to 0.4 Torr, particle size unexpectedly decreases with increasing sputtering pressure. A minimum particle size (approximately 0.3 nm for molybdenum) is reached somewhere between 0.4 and 0.6 Torr. Above 0.6 Torr, particles sizes increase with increasing pressure consistent with thermal evaporation results obtained in the gas condensation process where the particle size increases with increasing gas pressure above 1 Torr.

It has also been observed that the size of the particles in the particle layer decreases slightly when the sputtering voltage (and consequently power) increase.

FIG. 1 shows the transmission electron microscopy diffraction pattern of a composite material produced according to the invention comprising nanoscale molybdenum particles dispersed in a crystalline aluminum matrix. The spectrum shows only the interplanar spacings corresponding to superimposed individual spectra of aluminum and molybdenum. The bright broad ring in FIG. 1 represents overlapping rings due to aluminum (111) and molybdenum (110). The rest of the rings correspond to other aluminum and molybdenum interplanar spacings. This spectrum indicates that both aluminum and molybdenum were deposited as elemental crystalline phases with no evidence of any alloying or of any additional phases.

Figure 2:
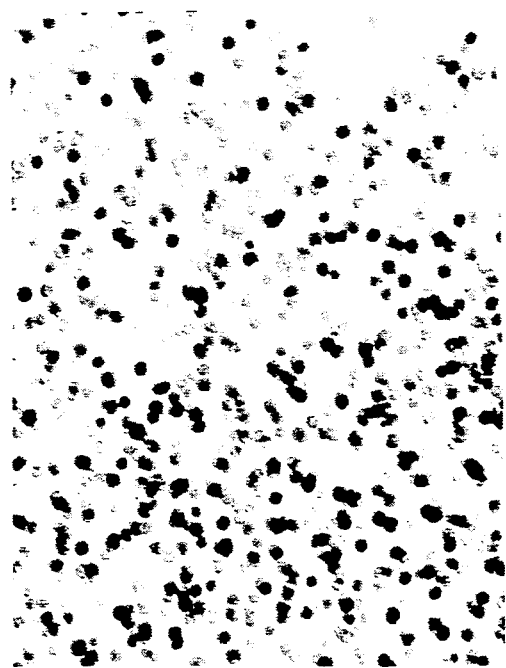
FIG. 2 is a bright field transmission electron micrograph of nanoscale molybdenum particles produced at a sputtering pressure of 0.2 Torr embedded in an aluminum matrix.

FIG. 2 shows a bright field transmission electron microscopy micrograph of nanoscale molybdenum particles which appear as dark spots, embedded in an aluminum matrix. This is a spectrum of a composite material according to the invention produced in accordance with Example 1 using a sputtering power of 150 watts at an argon sputtering pressure of 0.2 Torr for sputtering the discrete particle layer. The narrow size distribution of the particles is clearly apparent from the electron micrograph.

Figure 3:
FIG. 3 is another bright field transmission electron micrograph of a composite material incorporating molybdenum particles similar to those of FIG. 2, except produced at a sputtering pressure of 0.4 Torr.

FIG. 3 is a bright field transmission electron microscopy micrograph of crystalline nanoscale elemental molybdenum particles embedded in a crystalline aluminum matrix produced in accordance with Example 2 using a sputtering power of 150 watts and an argon sputtering pressure of 0.4 Torr for sputtering the discrete particle layer. The smaller size of the particles produced at a higher argon sputtering pressure is clearly apparent.

The foregoing description and examples have been set forth merely to illustrate the invention and are not intended to be limiting. Since modifications of the described embodiments incorporating the spirit and substance of the invention may occur to a person skilled in the art, the scope of the invention should be construed broadly to embrace everything within the ambit of the appended claims and equivalents thereof.

What is claimed is:

1. A method of producing a composite material comprising the steps of:
    (a) sputtering a continuous phase layer of a first element from a first sputtering target onto a substrate at a first sputtering pressure which is sufficiently low that a continuous phase layer is deposited;
    (b) maintaining a thermal gradient between said substrate and a second sputtering target composed of a second element whereby said substrate is at a lower temperature than said second sputtering target, and sputtering a layer of discrete particles of said second element having a particle size from about 1 to about 50 nm from said second sputtering target onto the previously deposited sputtered layer of said first element at a second sputtering pressure higher than said first sputtering pressure, said second sputtering pressure being sufficiently high that a layer of discrete particles is deposited; and
    (c) sputtering a further continuous phase layer of said first element over said layer of discrete particles at a third sputtering pressure lower than said second sputtering pressure, said third sputtering pressure being sufficiently low that a continuous phase layer is deposited.

2. A method according to claim 1, further comprising repeating steps (b) and (c) until a desired composite material thickness is built up.

3. A method according to claim 1, wherein said first element is aluminum and said second element is molybdenum.

4. A method according to claim 1, wherein said thermal gradient is maintained by cooling said substrate.

5. A method according to claim 4, wherein said substrate is cooled with liquid nitrogen.

6. A method according to claim 1, wherein the sputtering pressures are maintained by carrying out the sputtering steps in a sputtering chamber containing an inert gas atmosphere.

7. A method according to claim 6, wherein sputtering is carried out in a sputtering chamber containing an argon atmosphere.

8. A method according to claim 1, wherein said continuous phase layers are deposited at a sputtering pressure of about 0.001 Torr.

9. A method according to claim 1, wherein said layer of discrete particles is deposited at a sputtering pressure in the range from about 0.1 to about 10 Torr.

10. A method according to claim 9, wherein said layer of discrete particles is deposited at a sputtering pressure in the range from about 0.15 to about 1 Torr.

11. A method according to claim 10, wherein said layer of discrete particles is deposited at a sputtering pressure in the range from about 0.2 to about 0.7 Torr.

12. A method according to claim 11, wherein said layer of discrete particles is deposited at a sputtering pressure in the range from about 0.3 to about 0.6 Torr.

13. A method according to claim 1, wherein said substrate is disposed a distance in the range from about 2 to about 20 cm from said second sputtering target during sputtering said layer of discrete particles.

14. A method according to claim 13, wherein said substrate is disposed a distance in the range from about 5 to about 12 cm from said second sputtering target during sputtering said layer of discrete particles.

15. A method according to claim 14, wherein said substrate is disposed a distance in the range from about 7 to about 10 cm from said second sputtering target during sputtering said layer of discrete particles.

16. A method according to claim 1, wherein said discrete particles have a particle size in the range from about 2 to about 20 nm.

17. A method according to claim 16, wherein said discrete particles have a particle size in the range from about 3 to about 12 nm.

18. A method according to claim 17, wherein said discrete particles have a particle size of about 7 nm.

19. A method according to claim 1, wherein said discrete particles are crystalline.

20. A method according to claim 19, wherein said discrete particles and said continuous phase matrix are each crystalline.

21. A method according to claim 1, wherein a bimodal size distribution of discrete particles having respective particle sizes of about 20 nm and about 5 nm is produced during sputtering said layer of discrete particles.

22. A method according to claim 1, wherein said first and second elements are normally miscible with each other to form an alloy.

23. A method according to claim 1, wherein said first and second elements are normally reactive with each other in the vapor phase to form a compound.

24. A method according to claim 1, wherein the sputtering pressure during sputtering of said layer of discrete particles is from about 10 to about 1000 times the pressure during sputtering of said continuous phase layers.

25. A method according to claim 24, wherein the sputtering pressure during sputtering of said layer of discrete particles is at least about 100 times the pressure during sputtering of said continuous layers.

26. A method according to claim 1, wherein said discrete particles of said second element comprise from about 0.1 vol.-% to about 63 vol.-% of said composite material.

27. A method according to claim 26, wherein said discrete particles of said second element comprise from about 5 vol.-% to about 20 vol.-% of said composite material.

28. A method according to claim 1, wherein said continuous phase layers are sputtered at a sputtering power in the range from about 2.5 watts/cm$^2$ to about 250 watts/cm$^2$.

29. A method according to claim 28, wherein said continuous phase layers are sputtered at a sputtering power of about 50 watts/cm$^2$.

30. A method according to claim 1, wherein said layer of discrete particles is sputtered at a sputtering power in the range from about 6.25 watts/cm$^2$ to about 25 watts/cm$^2$.

31. A method according to claim 30, wherein said layer of discrete particles is sputtered at a sputtering power of about 18.5 watts/cm$^2$.

32. A method according to claim 2, wherein each repetition of steps (b) and (c) produces an individual sublayer having a thickness of about 25 nm.

33. A method according to claim 32, wherein steps (b) and (c) are repeated sufficient to produce a composite material having a total thickness in the range from about 100 nm to about 500 nm.

34. A method according to claim 1, wherein the sputtering pressure is controlled during sputtering of said layer of discrete particles in order to regulate the size of said particles.

35. A method according to claim wherein the sputtering power is controlled during sputtering of said layer of discrete particles in order to regulate the vol.-% of said second element in said composite material.

36. A method according to claim 1, wherein the temperature difference of said thermal gradient is controlled during sputtering of said layer of discrete particles in order to regulate the velocity at which particles migrate from said second target to said substrate.

37. A method according to claim 1, wherein at least one of said sputtering steps in carried out in the presence of a reactive gas to deposit a compound reaction product on said substrate.

38. A method according to claim 37, wherein said reactive gas is selected from the group consisting of oxygen, nitrogen and water vapor.

* * * * *